United States Patent
Lo et al.

(10) Patent No.: US 7,682,914 B2
(45) Date of Patent: Mar. 23, 2010

(54) FULLY SALICIDED (FUCA) MOSFET STRUCTURE

(75) Inventors: Patrick Guo Qiang Lo, Singapore (SG); Wei Yip Loh, Singapore (SG); Ranganathan Nagarajan, Singapore (SG); Narayanan Balasubramanian, Singapore (SG)

(73) Assignee: Agency for Science, Technololgy, and Research, Singapore (SG)

( * ) Notice: Subject to any disclaimer, the term of this patent is extended or adjusted under 35 U.S.C. 154(b) by 300 days.

(21) Appl. No.: 11/981,496

(22) Filed: Oct. 30, 2007

(65) Prior Publication Data

US 2008/0064153 A1    Mar. 13, 2008

Related U.S. Application Data

(62) Division of application No. 11/071,768, filed on Mar. 3, 2005, now Pat. No. 7,294,890.

(51) Int. Cl.
    *H01L 21/336*    (2006.01)
(52) U.S. Cl. ............... 438/300; 438/583; 438/655; 257/E21.619
(58) Field of Classification Search ............. 438/300, 438/580, 581, 582, 583, 655; 257/E21.619
    See application file for complete search history.

(56) References Cited

U.S. PATENT DOCUMENTS

| | | | |
|---|---|---|---|
| 5,953,605 A | * | 9/1999 | Kodama ............ 438/231 |
| 5,960,270 A | | 9/1999 | Misra et al. |
| 6,110,787 A | * | 8/2000 | Chan et al. ............ 438/300 |
| 6,204,103 B1 | | 3/2001 | Bai et al. |
| 6,284,609 B1 | | 9/2001 | Ang et al. |
| 2004/0094804 A1 | | 5/2004 | Amos et al. |

OTHER PUBLICATIONS

"Issues in NiSi-gated FDSOI Device Integration," by Kedzierski et al., 2003 IEEE, 0-7803-7873-3/03, 4 pgs., IBM Semiconductor Research and Development Center (SRDC).

* cited by examiner

*Primary Examiner*—Chandra Chaudhari
(74) *Attorney, Agent, or Firm*—Saile Ackerman LLC; Stephen B. Ackerman

(57) ABSTRACT

A method is described to form a MOSFET with a fully silicided gate electrode and fully silicided, raised S/D elements that are nearly coplanar to allow a wider process margin when forming contacts to silicided regions. An insulator block layer is formed over STI regions and a conformal silicidation stop layer such as Ti/TiN is disposed on the insulator block layer and active region. A polysilicon layer is deposited on the silicidation stop layer and is planarized by a CMP process to form raised S/D elements. An oxide hardmask on the gate electrode is removed to produce a slight recess between the spacers. A silicidation process yields a gate electrode and raised S/D elements comprised of NiSi. Optionally, a recess is formed in the substrate between an insulator block mask and spacer and a Schottky barrier is used instead of a silicidation stop layer to form a Schottky Barrier MOSFET.

20 Claims, 6 Drawing Sheets

FULLY SALICIDED (FUCA) MOSFET STRUCTURE

This is a Divisional application of U.S. patent application Ser. No. 11/071,768, filed on Mar. 3, 2005 now U.S. Pat. No. 7,294,890, which is herein incorporated by reference in its entirety, and assigned to a common assignee.

FIELD OF THE INVENTION

The present invention relates to a MOSFET structure design and fabrication process and in particular to a MOSFET device with planarized gate and source/drain (S/D) regions wherein the gate and S/D regions are self-aligned, fully silicided, and have silicidation stoppers which are a gate dielectric layer and metallic barrier, respectively.

BACKGROUND OF THE INVENTION

The demand for greater circuit density and higher performance in Complementary Metal Oxide Semiconductor (CMOS) transistors is driving the critical gate dimension to 65 nm and below. For MOS-based IC manufacturing, a polysilicon gate has been used for many generations in spite of some shortcomings that include the well known poly-depletion effect which was first recognized over 10 years ago. The continued miniaturization of MOS Field Effect Transistor (MOSFET) devices and associated demand for better channel electrostatic control, higher gate capacitance, and higher drive current means that the gate dielectric thickness needs to be scaled down aggressively. For the 65 nm technology node and beyond, the equivalent electrical gate oxide thickness (EOT) must be thinned to below 15 Angstroms. Since poly-depletion has consistently contributed 4 to 10 Angstroms to the total EOT, the poly-depletion effect is no longer acceptable, regardless of advancements made on the high k dielectric layer between the gate and channel. To reduce the high gate resistance and poly-depletion problems, the active dopant density in the polysilicon gate must be increased. However, this practice leads to carrier mobility degradation. Thus, a considerable amount of research and development effort is taking place to identify an alternative gate electrode such as a metal electrode that is much more conductive than conventional heavily doped polysilicon gates and is free of the poly-depletion issue.

Many types of metal electrodes and associated schemes have been investigated. Examples of conductive materials used in metal gate technology are metals such as W and Mo, metal suicides including nickel silicide and cobalt silicide, and metallic nitrides such as TiN and WN. An important requirement for a gate electrode is its capability of having a tunable work function ($\Phi_m$) around its mid-gap so that the threshold voltage (Vth) for NMOS and PMOS devices can be obtained symmetrically. One attractive approach for implementing a metal gate in a transistor device is to employ a silicidation process that completely consumes a conventional polysilicon gate electrode which is converted to a silicide. A metal gate formed through the process of silicidation and referred to as a Fully Silicided (FUSI) poly gate is a strong contender for gate electrode in advanced technologies because an n-type or p-type dopant that is implanted into polysilicon can modulate the final $\Phi_m$ around the $\Phi_{Mid\text{-}Gap}$ such as in pure nickel silicide without dopant. In other words, a semiconductor has a certain energy level measured by its Fermi level or $E_F$. An undoped semiconductor has an $E_F$ generally at the middle of the bandgap. N-type doping adjusts the $E_F$ closer to the conduction band while p-type doping moves the $E_F$ nearer the valence band.

There are several examples of FUSI poly gates but the methodology with regard to assembling all processes effectively seems lacking. Moreover, a better design is needed to overcome some performance issues and to enable a lower cost manufacturing process that involves fewer steps.

A recent improvement in the design of transistor devices involves raised source and drain regions which increases the thickness of the source and drain regions available for the silicidation process and lowers sheet resistance of the source and drain regions. An example of elevated source/drain regions that are coplanar with a metal gate electrode is found in U.S. Pat. No. 6,284,609 in which a doped epitaxial growth serves as a raised source/drain region. A metal gate is enclosed on the sides and bottom by oxide liners and a gate dielectric layer, respectively. However, selective epitaxial growth (SEG) requires a separate tool set and the process itself is not easy to perform, thereby increasing manufacturing expense. Additionally, gate formation requires removing a dielectric layer above the channel by an etch process which could damage the substrate below the subsequently formed gate.

In U.S. Pat. No. 6,204,103, a transistor device having fully silicided polysilicon gates and silicided S/D regions is disclosed. One drawback is that the gates and S/D regions are silicided in separate steps that could have different thermal budget allowances and thereby lead to thermal instability and an increase in S/D resistance. Secondly, the gate and S/D regions are not coplanar which could lead to complications during a subsequent etch step that opens contact holes to silicided regions. Moreover, separate masks are required for patterning two different metal layers on the respective gates.

U.S. Pat. No. 5,960,270 describes a MOS transistor in which a metal gate is deposited in an opening above the channel region after silicided S/D regions are formed in the substrate. However, damage to the gate region could easily occur during etching to remove a sacrificial gate. Since the gate region is the most critical portion of a transistor, a gate replacement scheme as disclosed here is questionable in terms of process margin.

U.S. Patent Application 2004/0094804 and a related publication entitled "Issues in NiSi-gated FDSOI device integration", J. Kedzierski, et al., IEDM, 2003, describe fully depleted silicon on insulator (FDSOI) devices with NiSi metal gates. While this approach appears to more closely resemble a full integration flow than other prior art examples, the fabrication still has the disadvantages of separate S/D and gate silicidations, SEG to raise the S/D regions, and non-planar gate and raised S/D regions.

In silicon-on-insulator (SOI) technology, the source/drain regions are formed above an insulator layer, allowing a significant reduction in the source and drain depletion capacitance. On the other hand, for a thin body SOI case, a high series resistance associated with fully silicided source and drain regions and due to the significantly reduced side contact areas, must be overcome before SOI technology is implemented in manufacturing.

In summary, there are several obstacles to implementing fully silicided gates and S/D regions in CMOS technology. Current process flows are too complex and incur extra cost because S/D and gate silicidation occur separately. Note that a gate has a greater thickness than S/D regions which require thinner silicide to avoid S/D junction leakage. Typically, a second (gate) silicidation demands a higher temperature and longer time than S/D silicidation to avoid non-uniform NiSi (phase) formation that causes $\Phi_m$ variability. A high thermal budget for the gate silicidation could affect the pre-formed S/D silicide (often NiSi as well) with a resulting Rs increase from silicide agglomeration. When a SEG process is implemented to raise the S/D region, an extra tool and more process time are needed. Even so, the SEG thickness is limited and cannot achieve a level that is coplanar with the gate. Subjecting a thick gate and a thinner raised S/D region to a single silicidation process will likely cause S/D junction damage. A fourth issue is non-planarity of silicided gate and S/D regions as mentioned previously. A fifth concern is that a SEG raised S/D thickness is limited and even a silicided SEG raised S/D region is not thick enough to separate a subsequently formed Cu contact in a BEOL process flow from an active S/D with sufficient distance.

SUMMARY OF THE INVENTION

One objective of the present invention is to provide a MOSFET structure with a fully silicided gate and S/D regions that are nearly coplanar.

A further objective of the present invention is to provide a MOSFET structure according to the first objective in which the fully silicided gate and S/D regions are separated by a spacer and by a slight recess in the gate below the top of the spacer.

A still further objective of the present invention is to provide a MOSFET structure according to the first objective wherein silicidation stoppers are formed adjacent to the fully silicided gate and S/D regions.

Yet another objective of the present invention is to provide a cost effective method of fabricating fully silicided and nearly planar gate and S/D regions in which selective epitaxial growth (SEG) is not used and the silicidation is performed in a single step.

These objectives are achieved in a first embodiment by providing a substrate such as silicon on which a transistor is to be formed. Optionally, in an SOI embodiment, the substrate may be comprised of an insulating layer with a semiconductor layer formed thereon. In the exemplary embodiment, shallow trench Isolation (STI) regions are formed in the substrate to define an active region. A stack formed by sequentially forming a gate dielectric layer, a polysilicon layer, an oxide hard mask, and a nitride hard mask on the substrate is patterned by conventional photolithography and etching techniques to fabricate a gate electrode and overlying hard mask above the channel in the active region. A first ion implant is performed to implant a p-type or n-type dopant in the exposed active regions to form source/drain extensions. Next, a spacer comprised of an inner oxide layer and an outer nitride layer is formed on either side of the gate electrode and a second implant is performed followed by activation anneal to form heavily doped source/drain (S/D) elements as contact S/D regions between each spacer and an adjacent isolation region. Thereafter, an insulator layer such as silicon oxide is deposited on the substrate and is selectively patterned to produce an insulator block mask over each STI region. A silicidation stop layer such as Ti/TiN and a conductive layer made of polysilicon, SiGe, SiGeC, or Ge, for example, are sequentially deposited on the insulator block mask and over the entire active region. After a Chemical Mechanical Polish (CMP) process is performed to planarize the partially formed transistor, remove the nitride hard mask, and form raised S/D elements from the conductive layer, the exposed oxide hard mask is removed by an HF dip. Finally, a metal layer such as Ni is deposited on the insulator block mask and transistor region and a silicidation process is employed to fully silicide the gate and raised S/D elements. Unreacted metal is removed to yield a MOSFET with fully silicided gate and raised S/D elements that are nearly coplanar. The fully silicided and raised S/D elements are advantageously bounded on the sides and bottom by silicidation stop layers.

In a second embodiment that represents formation of a Schottky Barrier MOSFET, a gate dielectric layer, gate electrode, and overlying oxide/nitride hard mask with abutting oxide/nitride spacers are formed as in the first embodiment except there are no LDD regions or heavily doped S/D regions in the substrate. An insulator block mask as mentioned earlier is disposed on the STI regions. In this case, the insulator block mask, spacers, and gate stack serve as an etch mask while a trench is etched in exposed regions of the substrate. Once an overlying photoresist mask above the insulator block mask is removed, a Schottky barrier having a lower metal layer made of Pt, Ni, Co, Ti, Dy, Er, or the like and an upper TiN cap layer is conformally laid down. Thereafter, a conductive layer such as polysilicon is deposited on the insulator block mask and transistor region. A similar sequence as described previously that involves CMP to remove the nitride hard mask, HF dip to remove the oxide hard mask, metal deposition, and silicidation is followed to form a Schottky Barrier MOSFET. The resulting fully silicided gate electrode and S/D elements are nearly coplanar. In this case, the Schottky barrier layer extends into the substrate to allow a thicker silicide layer (raised S/D element) thereon. Thus, vertical S/D engineering is made possible.

The present invention is also a transistor formed by a method of the present invention. The transistor is based on a substrate with STI regions formed therein and is comprised of a fully silicided gate electrode that is nearly coplanar with fully silicided and raised S/D elements. The slightly recessed gate is separated from the raised S/D elements by an oxide/nitride spacer which may be adjusted in width to optimize side capacitance and resistance of the S/D extension region under each spacer. There is an insulator block mask overlying each STI region in the substrate. A silicidation stopper layer is conformally formed along one side of the insulator block mask, above a portion of the S/D region in the substrate, and along the side of the adjacent nitride spacer. For a Schottky Barrier MOSFET, a Schottky barrier layer extends into the substrate and is confined between the tip of the spacer and the tip of the insulator block mask.

BRIEF DESCRIPTION OF THE DRAWINGS

The present invention is illustrated by way of example and not limitation in the accompanying figures, in which like references indicate similar elements, and in which.

DETAILED DESCRIPTION OF THE INVENTION

The present invention generally relates to semiconductor devices with raised source/drain (S/D) elements and gate electrodes (gates), both of which are fully silicided. More particularly, the invention relates to a MOSFET having a gate that is nearly coplanar with the raised S/D elements and wherein the raised S/D elements are bounded on the sides and bottom by a silicidation stopper layer. The first embodiment illustrated in FIGS. 1-7 relates to a MOSFET with conventional lightly doped source/drain (LDD) extension regions and heavily doped S/D contact regions. A second embodiment depicted in FIGS. 8-12 represents a Schottky Barrier MOSFET wherein the silicidation stopper layer is a Schottky barrier that extends into the substrate.

Figure 1:
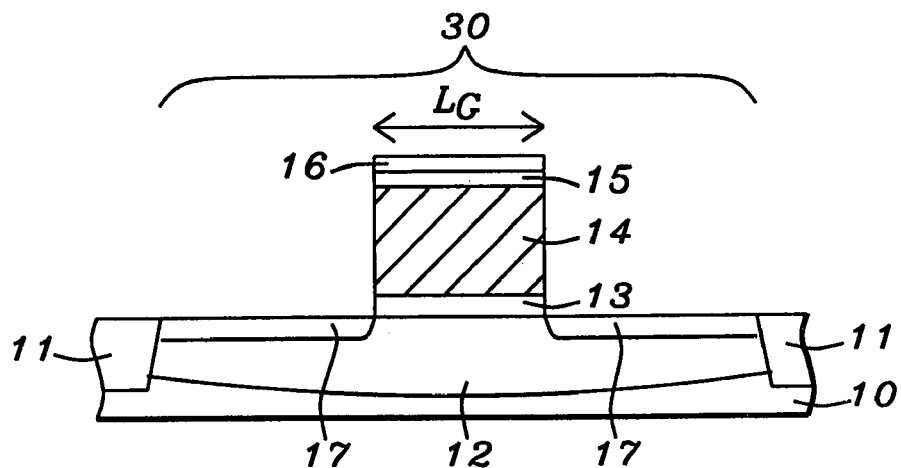
FIG. 1 is a cross-sectional view that depicts a partially formed MOSFET with a hard mask above a gate electrode according to one embodiment of the present invention.

Referring to FIG. 1, there is shown a partially formed transistor (MOSFET) 30 that is based on a substrate 10 which may be silicon, silicon-germanium, or another semiconductor material used in the art. Optionally, the substrate 10 may be a silicon (or silicon-germanium, germanium, or any other semiconductor material of interest)-on-insulator (SOI) structure comprised of a stack (not shown) in which a semiconductor layer is formed on an insulator that is disposed on a substructure which may contain active and passive devices as appreciated by those skilled in the art. It is understood that a substrate comprised of more than one device may be referred to as a chip. In SOI technology, the insulator layer is typically silicon oxide and has a thickness from about 100 to 5000 Angstroms while the semiconductor layer has a thickness between about 10 and 1000 Angstroms (or can be thicker as needed).

In the exemplary embodiment, the substrate 10 is comprised of silicon and an n-well or p-well 12 is formed therein by a well known method. Thereafter, isolation regions such as shallow trench isolation (STI) regions 11 typically made of silicon oxide or a low k dielectric material are formed in the substrate 10 by a conventional process and thereby define the active region of the partially formed MOSFET 30. STI regions 11 may be coplanar with the substrate 10 as pictured in the drawings, slightly elevated above the substrate, or slightly recessed below the substrate.

A gate stack comprised of a gate dielectric layer 13, gate layer 14, silicon oxide layer 15, and silicon nitride layer 16 is sequentially laid down by a chemical vapor deposition (CVD) method, plasma enhanced CVD (PECVD), or the like. The gate dielectric layer 13 preferably has a thickness of about 5 to 200 Angstroms (in effective oxide thickness, EOT) and may be comprised of one or more of silicon oxide, silicon oxynitride, or silicon nitride. For instance, an EOT of approximately 15 Angstroms is preferred for the 65 nm technology node. Alternatively, gate dielectric layer 13 may be comprised of one or more high k dielectric materials known to those skilled in the art. A high k dielectric material enables an increase in the physical thickness of the gate dielectric layer 13 to suppress tunneling current and prevent a high gate leakage current while maintaining minimum desired EOT. However, a high k dielectric layer generally has a lower thermal stability than silicon oxide, silicon nitride, or silicon oxynitride, and is employed only when subsequent thermal processes may be restricted to temperatures that do not exceed the thermal stability limit of the high k dielectric layer. In an alternative embodiment, the gate dielectric layer 13 is comprised of a high k dielectric layer formed on an interfacial layer that is $SiO_2$, silicon nitride, or silicon oxynitride.

The gate layer 14 is a conductive material which may be made of doped or undoped polysilicon having a thickness of 300 to 1500 Angstroms and preferably about 500 Angstroms. Silicon oxide layer 15 with a thickness of 100 to 500 Angstroms and preferably about 300 Angstroms, and silicon nitride layer 16 having a thickness between 100 and 500 Angstroms and preferably about 300 Angstroms, are referred to as hard masks since they protect the gate 14 during subsequent etching and CMP processes. The stack is patterned by conventional lithography and etching techniques that may include a trim etch to form a gate length $L_G$ that is smaller than can be achieved by a lithography method followed by an anisotropic etch. Hereafter, the patterned gate layer is referred to as a gate or gate electrode 14.

A first ion implant may be performed by a well known method to provide lightly doped source and drain extension (LDD) regions 17 with an appropriate n-type or p-type dopant in substrate 10 between the gate dielectric layer 13 and the STI regions 11. When the MOSFET 30 is a PMOS type, the channel (not shown) below the subsequently formed gate dielectric layer 13 will have n-type conductivity while the adjacent LDD regions 17 will be comprised of a p-type dopant. Alternatively, the MOSFET 30 may be a NMOS type wherein the channel below the gate dielectric layer 13 has p-type conductivity and adjacent LDD regions 17 have an n-type dopant.

Figure 2:
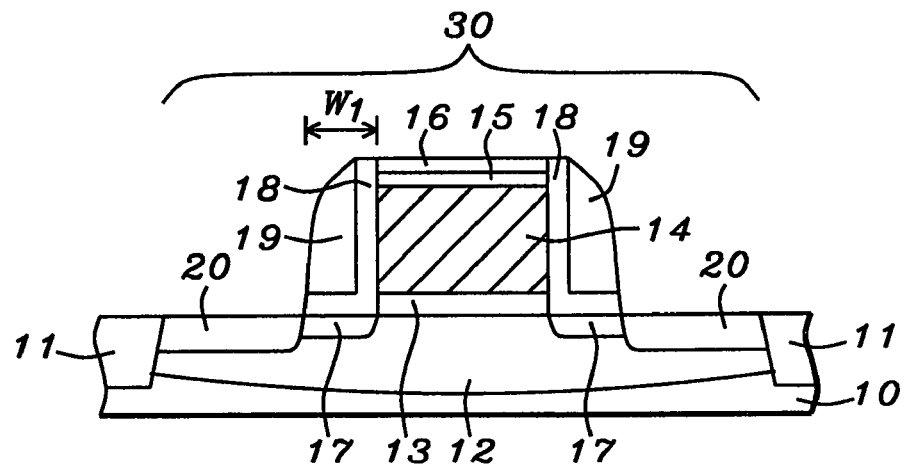
FIG. 2 is a cross-sectional view of the structure in FIG. 1 after spacers are added adjacent to the gate and S/D regions are formed in the substrate.

Referring to FIG. 2, a conventional sidewall oxide deposition may be employed to form a silicon oxide layer 18 on the substrate 10 and along the sides of the gate 14. Thereafter a silicon nitride layer 19 is deposited by a CVD or PECVD technique on the silicon oxide layer 18. A well known etch process is followed to fabricate an inner oxide spacer 18 and an outer nitride spacer 19 along the gate 14 and above LDD regions 17. The maximum width of the spacers 18/19 along the top surface of substrate 10 is $w_1$. Heavily doped S/D regions 20 may then be formed and activated by an appropriate implant between the spacers 18/19 and the adjacent STI region 11 followed by an anneal and activation process, e.g., furnace anneal, or rapid thermal anneal, or a more advanced laser-anneal, as understood by those skilled in the art.

Figure 3:
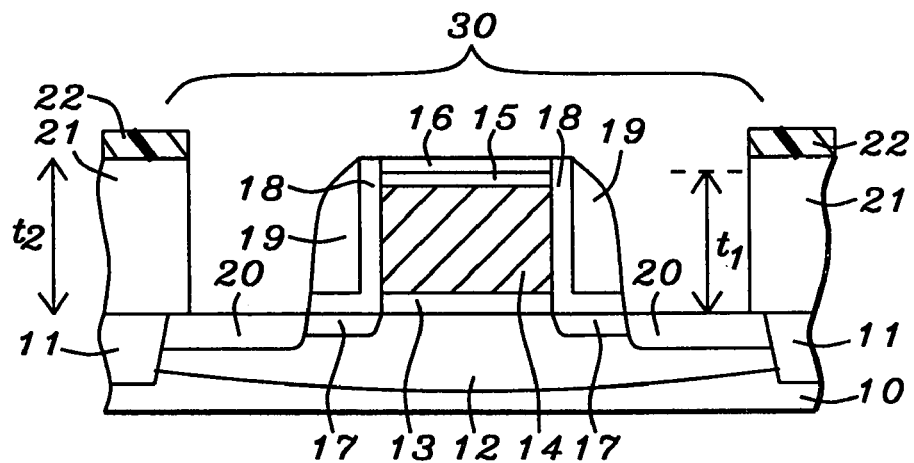
FIG. 3 is a cross-sectional view of the structure in FIG. 2 after an insulator block mask is formed above isolation regions according to the present invention.

Referring to FIG. 3, an insulator layer 21 such as a silicon oxide layer with a thickness $t_2$ of from 500 to 2500 Angstroms is deposited on the transistor region 30 and over the STI regions 11 by a CVD or PECVD method. Note that the thickness $t_2$ is about equivalent to the thickness of the gate stack (layers 13-16) and is preferably larger than the distance $t_1$ which represents the combined thickness of the gate dielectric layer 13, gate 14, and oxide hardmask 15. In a preferred embodiment practiced by the inventors, $t_2$ is about 1100 Angstroms. In an alternative embodiment, the insulator layer may be a composite layer comprised of silicon oxide and silicon nitride or may be a composite of other insulator materials that are compatible with a subsequent patterning process as described in the following section.

A photoresist layer 22 is patterned on the insulator layer 21 and serves as an etch mask while a conventional wet or dry oxide etch is used to remove the exposed insulator layer. The silicon nitride spacer 19 and silicon nitride hard mask 16 protect the silicon oxide hard mask 15 and a substantial portion of the silicon oxide spacer 18. As a result, the remaining insulator layer is referred to as an insulator block mask 21 that covers the STI regions 11 and may extend slightly over the heavily doped S/D regions 20 to allow for some alignment error. The nitride hard mask 16, spacers 18/19 and a substantial portion of S/D regions 20 are now uncovered. The insulator block mask 21 advantageously serves as an electrostatic discharge (ESD) mask as well so that a separate ESD masking step is not needed for this invention.

Figure 4:
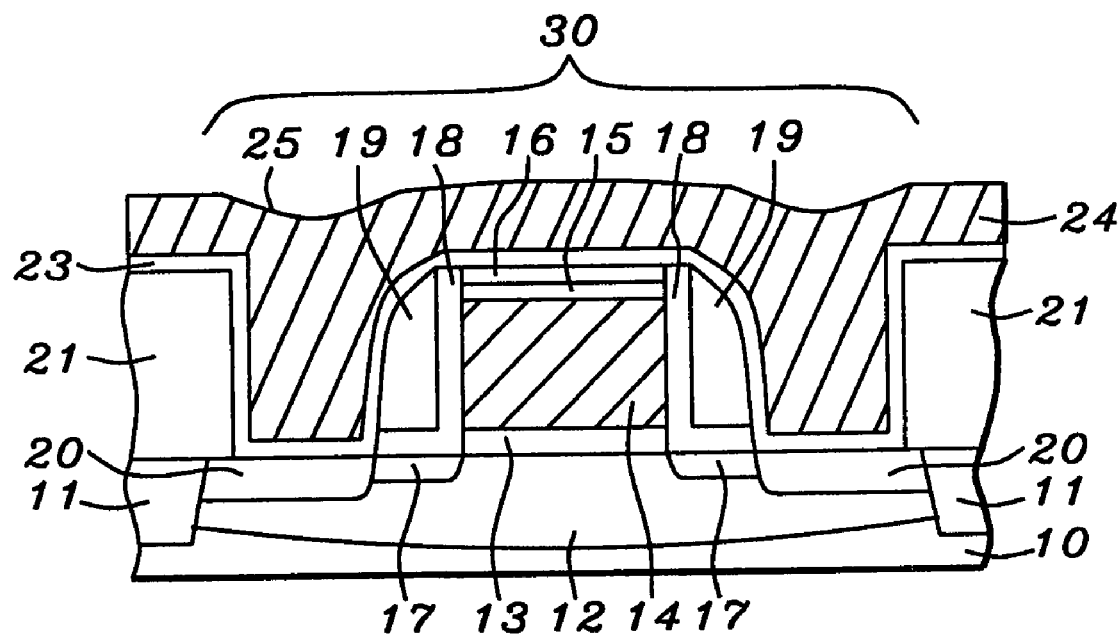
FIG. 4 is a cross-sectional view of the structure in FIG. 3 after a silicidation stop layer and conductive layer are deposited on the insulator block mask and active area.

Referring to FIG. 4, the photoresist layer 22 is removed by a standard stripping method and then a cleaning step may be employed to remove any organic residues from the insulator block mask 21 and transistor region 30. A silicidation stop layer 23 that is essentially a conformal coating and can also function to control contact resistance is deposited by a CVD, PECVD, or atomic layer deposition (ALD) method on the insulator block mask 21 and transistor region 30 to a thickness of from 30 to 300 Angstroms. Preferably, the silicidation stop layer 23 is a composite comprised of a lower Ti layer and an upper TiN layer. In one embodiment, the lower Ti layer is about 100 Angstroms thick and the upper TiN layer has a thickness of about 200 Angstroms. Optionally, the silicidation stop layer 23 may be comprised of Ni/TiN or Co/TiN. The silicidation stop layer 23 prevents a subsequent silicidation process from reacting with silicon in the substrate 10. The silicidation stop layer 23 has a vertical section along one side of the insulator block mask and has horizontal sections on the substrate 10, on the top surface of the insulator block mask 21, and on the gate stack. The silicidation stop layer 23 also has a curved section along the side of the spacers 18/19.

In the exemplary embodiment, a conductive layer 24 is formed that fills in the openings between the spacers 18/19 and insulator block mask 21 and has a top surface 25 that is above the level of the uppermost horizontal sections of the silicidation stop layer 23. The conductive layer 24 may be a polysilicon or amorphous layer that is deposited by a low temperature method at about 400° C. to 600° C. which is performed using a plasma enhanced CVD process (for lower temperature requirement) or a low pressure CVD process (if compatible for higher temperature requirement). The conductive layer 24 may be doped or undoped. Alternatively, the conductive layer 24 may be comprised of SiGe, SiGeC, or pure Ge in order to modify the mechanical and electrical characteristics of the subsequently formed fully silicided and raised S/D elements to be described in a later section.

Figure 5:
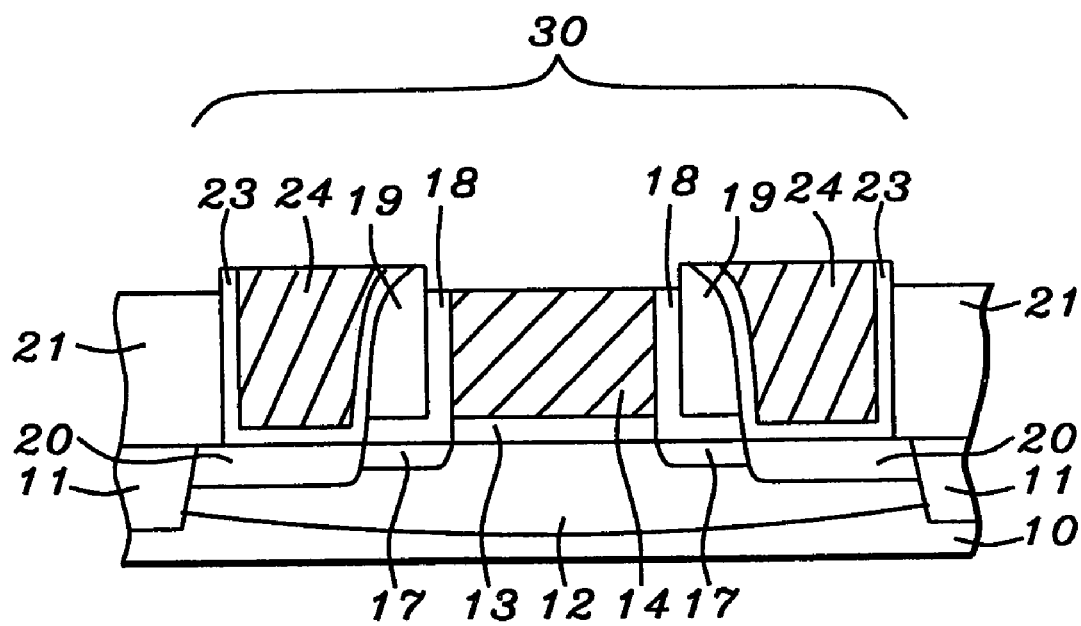
FIG. 5 is a cross-sectional view of the structure in FIG. 4 following a planarization process that forms raised S/D elements and after an etch that removes an oxide hard mask above the gate electrode.

Referring to FIG. 5, a conventional CMP process is performed that may involve more than one step to planarize the conductive layer 24 and remove the silicon nitride hardmask 16. The silicon oxide hard mask 15 serves as a CMP stop to prevent damage to the gate layer 14. During the CMP process, the horizontal section of the silicidation stop layer 23 above the top surface of the insulator block mask 21 is also removed along with an upper portion of the insulator block mask. The insulator block mask 21, silicidation stop layer 23, conductive layer 24, and spacers 18/19 are now essentially coplanar. The conductive layer 24 over each S/D region 20 is now a raised S/D element and is advantageously formed by a sequence that does not include selective epitaxial growth in order to reduce process complexity and cost. The distance between the gate 14 and raised S/D elements 24 may be increased by lengthening the CMP process time. In other words, the width of silicon nitride spacer 19 on the polished surface of the transistor region 30 becomes greater as the CMP process removes more of insulator block mask 21 and conductive layer 24.

Next, the gate 14 becomes slightly recessed below the top of the silicon nitride spacer 19 when the MOSFET 30 is subjected to an oxide etch such as a conventional BHF dip that removes the silicon oxide hard mask 15. At this point, the thickness of the combined silicidation stop layer 23 and conductive layer 24 is from 500 to 700 Angstroms while the gate 14 remains about 500 Angstroms thick. Note that the insulator block mask 21 and silicon oxide spacers 18 may also be thinned to a level that is about coplanar with the gate 14.

Figure 6:
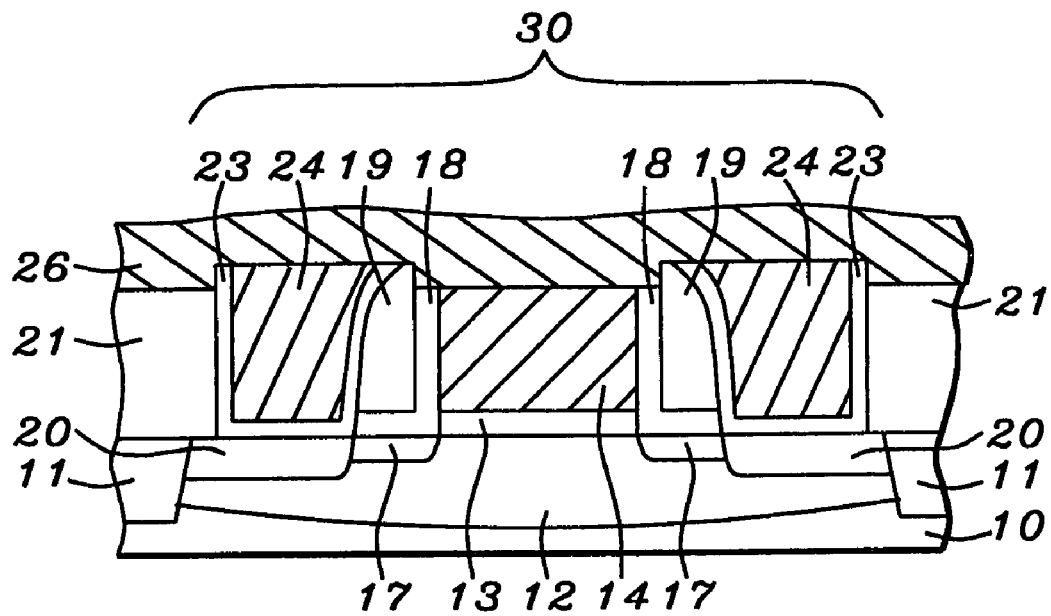
FIG. 6 is a cross-sectional view of the structure in FIG. 5 following deposition of a metal layer on the gate and planarized MOSFET surface.

Referring to FIG. 6, a metal layer 26 to be used in a subsequent step to form a metal silicide is deposited by a CVD, ALD, or physical vapor deposition (PVD) method to a thickness of about 100 to 1000 Angstroms on the insulator block mask 21 and on the transistor region 30. In one aspect, the metal layer 26 is a composite comprised of Ni and a TiN capping layer and is deposited by a PVD process. Optionally, the metal layer 26 may be comprised of Ni, Co, Pt, Ti, or any other conductive material that can be silicided to give the desired electrical and mechanical properties for a particular device.

Figure 7:
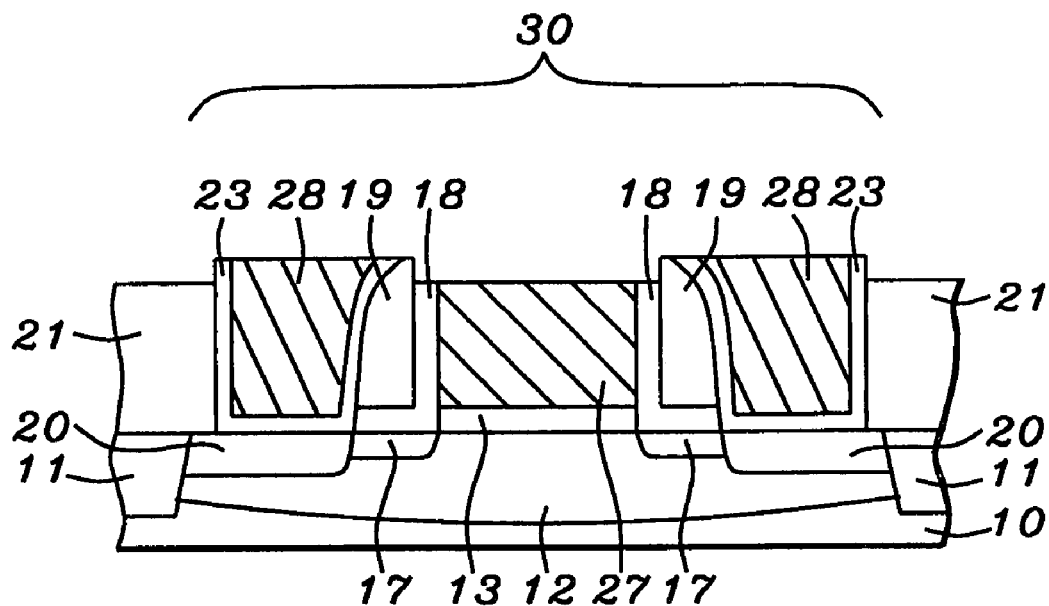
FIG. 7 is a cross-sectional view of the structure in FIG. 6 after a silicidation is performed and unreacted metal layer is removed to form a fully silicided gate electrode and fully silicided and raised S/D elements.

In FIG. 7, a silicidation step is carried out by heating the substrate 10 in a furnace with a $N_2$ or inert gas ambient at a temperature of 200° C. to 700° C. and preferably at 450° C. for about 15 to 30 minutes. Alternatively, a different type of anneal such as a conventional rapid thermal anneal (RTA) at a temperature of 200° C. to 700° C. for 10 to 120 seconds may be performed, depending on the desired characteristics of the silicide and integration limitations. It should be understood that the temperature used for the silicidation process depends upon the conductive material to be silicided. For instance, Ni requires a lower temperature than Ti. The gate 14 is transformed into a fully silicided gate electrode 27 and the conductive layer 24 is converted to a fully silicided and raised S/D element 28 on each side of the gate stack. Following the silicidation, unreacted metal layer 26 is selectively removed by a well known method such as treatment with a $H_2SO_4/H_2O_2$ solution at 130° C. for about 10 minutes. The formation of the transistor 30 is now essentially complete. Note that a standard process may follow such as a pre-metal dielectric (PMD) deposition. A PMD deposition is typically performed before any contact/metal formation.

One advantage of the method and structure of the present invention is that the fully silicided and raised S/D layer 28 is thicker than in prior art and thereby allows a copper backend of the line (BEOL) process flow to immediately follow. For instance, a silicon nitride layer (not shown) about 300 Angstroms thick may be deposited on the insulator block mask 21 and transistor region 30 to function as a Cu seal layer and etch stop layer during subsequent processing that forms contacts to the silicided regions. Thus, an extra process used in the prior art to form a W plug on S/D elements to increase the effective metal thickness before forming a silicon nitride or Cu seal layer in a Cu BEOL fabrication is no longer needed.

Another advantage of the first embodiment is that the present invention provides a MOSFET having a fully silicided gate and fully silicided and raised S/D elements that are about coplanar and thereby allows a wider process margin in a subsequent step that forms contacts to the silicided elements. For example, an etch to form contact holes can easily punch through into the S/D regions of the substrate when a shallow raised S/D element or no raised S/D element is employed. Furthermore, silicidation of the gate and raised S/D elements is accomplished in a single step that avoids process incompatibility associated with prior art methods that require two different silicidation steps. In the present invention, gate silicidation is controlled in both horizontal and vertical directions by spacers and the gate dielectric layer, respectively, while silicidation of raised S/D regions is controlled by a silicidation stop layer.

The silicidation stop layer is advantageously used in the first embodiment to enable a shallower S/D region in the substrate than was previously possible because in the present invention no silicon is lost from the substrate during silicidation. Thus, an ultra shallow S/D region can be achieved without a sheet resistance (Rs) penalty. The overall process is highly flexible since the fully silicided gate is compatible with high k gate dielectric layers and can be tuned for $\Phi_m$ and threshold voltage (Vth) control by appropriate gate doping prior to silicidation.

The present invention is also the MOSFET structure 30 otherwise known as a transistor shown in FIG. 7 that is comprised of a substrate 10 and a fully silicided gate 27 and fully silicided and raised S/D elements 28 that are nearly coplanar. The substrate 10 may be silicon and may be based on a SOI design that includes an insulating layer and overlying semiconductor layer that are formed on a substructure comprised of one or more other devices. The substrate 10 includes isolation regions 11, a channel (not shown) that has a certain conductivity type (n or p), S/D regions 20, and LDD regions 17 adjacent to the channel which have a conductivity type opposite to that of the channel. The transistor 30 further includes a gate dielectric layer 13 formed over the channel, a fully silicided gate electrode 27 on the gate dielectric layer, spacers 18/19 with a side and top surface formed adjacent to the sides of the gate electrode, and raised source/drain elements 28 that are fully silicided and bounded on the sides and bottom by a silicidation stop layer 23.

There is a vertical section of the silicidation stop layer 23 that abuts a side of the insulator block mask 21. The insulator block mask is comprised of two sides and a top surface and is formed above isolation regions 11. Another section of the silicidation stop layer 23 abuts the curved side of the silicon nitride spacer 19. There is a horizontal section of the silicidation stop layer 23 formed on the substrate on the S/D regions 20. The fully silicided gate 27 is slightly recessed below the top surface of the silicon nitride spacers 19 and fully silicided, raised S/D elements 28 by a distance of about 100 to 300 Angstroms.

The remaining aspects of elements in transistor 30 were previously described. The advantages of the transistor 30 are the same as those mentioned with respect to the first embodiment. Note that the lateral width of the spacers 18/19 between the fully silicided gate 27 and silicidation stop layer 23 may be increased to optimize side capacitance.

In an embodiment where the substrate comprises an SOI structure, the method of the present invention improves process yield and reduces contact resistance since the silicidation stopper layers prevent silicon loss from an ultra thin top semiconductor layer in the SOI substrate during the silicidation of the raised S/D elements.

In a second embodiment of the present invention, a Schottky Barrier MOSFET is fabricated according to the process flow depicted in FIGS. 8-12. The partially formed transistor 40 differs from the previously described transistor 30 in FIG. 2 in that both the LDD regions 17 and heavily doped S/D regions 20 are omitted. This means that all the ion implantation in the first embodiment is omitted in the second embodiment. Furthermore, a trench 31 is formed in the substrate (FIG. 9) between the insulator block mask 21 and horizontal section of silicon oxide spacer 18 and a Schottky barrier layer 33 (FIG. 10) replaces the silicidation stop layer 23 that was used in the first embodiment.

Figure 8:
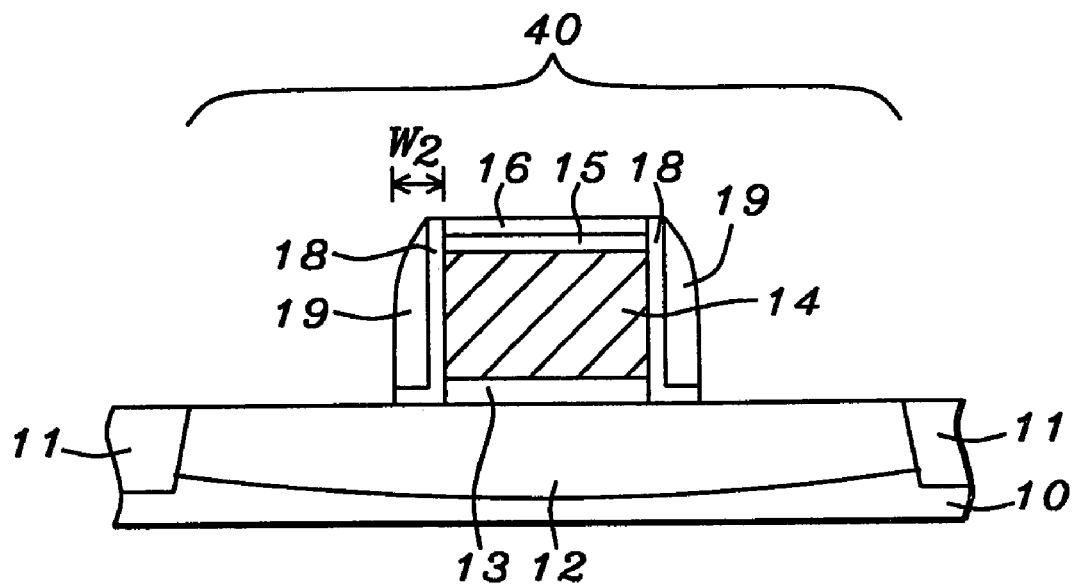
FIGS. 8-12 are cross-sectional views that represent a process of forming a Schottky Barrier MOSFET according to a second embodiment of the present invention.

All of the elements in FIG. 8 have been described previously and were formed according to the process sequence in the first embodiment except that no ion implantation was performed and LDD regions 17 and heavily doped S/D regions 20 are omitted. In the preferred embodiment, the maximum width $w_2$ of the spacers 18/19 is about one half of $w_1$ (FIG. 2) and is determined by the allowable resistance under the spacer region and by the allowable distance between the tips of the channel to the tips of the silicide formed in a subsequent step.

Figure 9:
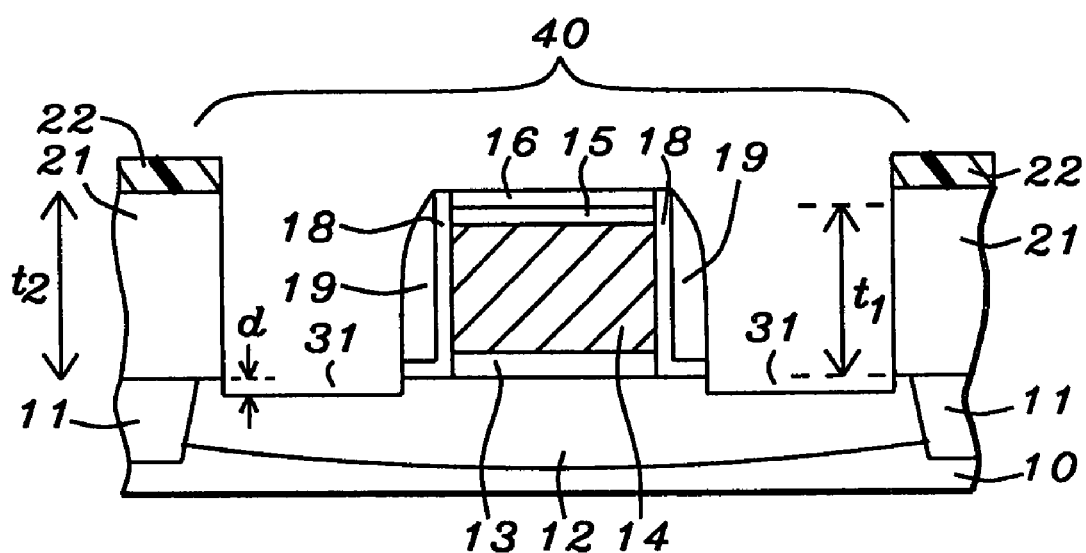

Referring to FIG. 9, an insulator block mask 21 with a thickness $t_2$ is formed by using a patterned photoresist layer 22 as an etch mask as described previously. It should be understood that one or more other insulator materials besides silicon oxide may be used to form an insulator block mask 21 as indicated in the first embodiment. Again, $t_2$ is preferably greater than $t_1$ which is the combined thickness of the gate dielectric layer 13, gate layer 14, and silicon oxide hard mask 15. The process sequence in the second embodiment differs from that in the first embodiment by adding an additional step wherein the photoresist layer 22, insulator block mask 21, and spacers 18/19 serve as an etch mask while a conventional etch process is employed to remove exposed portions of substrate 10. For example, a chlorine based reactive ion etch may be used to remove silicon from substrate 10. A source and drain (S/D) 31 which is a trench having a depth d of from 0 to 100 Angstroms and preferably less than 50 Angstroms is formed in substrate 10 between insulator block mask 21 and adjacent spacers 18/19.

Figure 10:
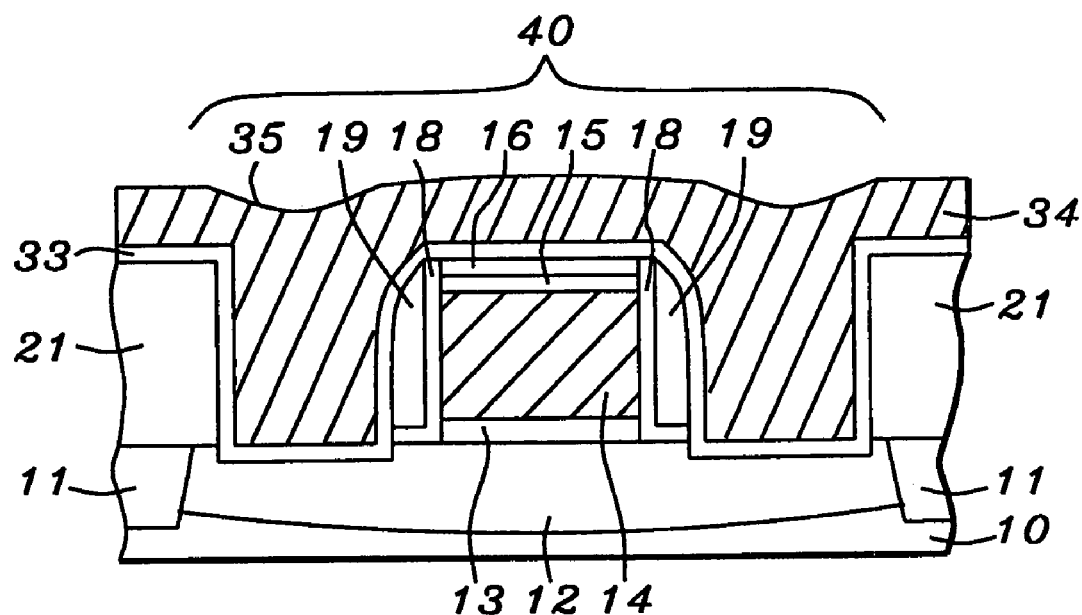

Referring to FIG. 10, the photoresist layer 22 is stripped by a conventional method and then a cleaning step may be performed to remove any organic residues on the insulator block mask 21 or in transistor region 40. A key step is now performed which is deposition of a Schottky barrier 33 by a CVD, PECVD, or ALD method, or by a combination of two or more of the aforementioned techniques. In one embodiment, the Schottky barrier 33 is a composite layer having a lower metal layer comprised of Ni about 50 to 100 Angstroms thick and an upper TiN cap layer with a thickness of about 100 to 300 Angstroms. Alternatively, the Schottky metal layer may be comprised of Pt, Co, Dy, Er, or Ti as appreciated by those skilled in the art. Note that the Schottky barrier 33 preferably covers the S/D 31 and is generally conformal to side and top surface of the insulator block mask 21 and to the transistor region 40 on which it is formed. In other words, the Schottky barrier 33 has a vertical section along the side of the insulator block mask 21 and has horizontal sections on the top surface of the insulator block mask, in the S/D 31, and on the top surface of the spacers and gate stack. Moreover, the Schottky barrier 33 conforms to the curved side of the silicon nitride spacers 19

Thereafter, a conductive layer 34 is deposited on the Schottky barrier 33 by using a low temperature method similar to the one mentioned with respect to conductive layer 24 in the first embodiment. Preferably, the conductive layer 34 is polysilicon but optionally may be SiGe, SiGeC, or Ge. Conductive layer 34 has a top surface 35 that is at a higher level than the uppermost horizontal sections of the Schottky barrier 33.

Figure 11:
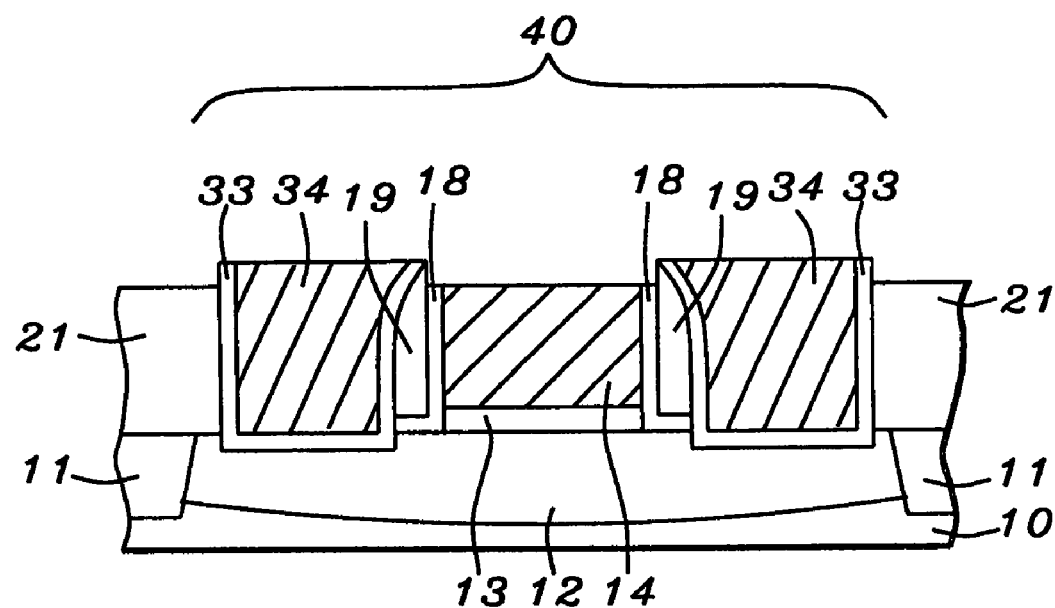

Referring to FIG. 11, a conventional CMP process is performed that may involve more than one step to planarize the conductive layer 34 and remove the silicon nitride hardmask 16. The silicon oxide hard mask 15 serves as a CMP stop to prevent damage to the gate 14. During the CMP process, the horizontal sections of the Schottky barrier 33 on the top surfaces of the insulator block mask 21, spacers 18/19, and gate stack are also removed along with upper portions of the insulator block mask and spacers 18/19. The insulator block mask 21, Schottky barrier 33, conductive layer 34, and spacers 18/19 are now essentially coplanar. The conductive layer 34 is now a raised S/D element over the Schottky barrier 33 in the S/D 31 on either side of the gate stack. Note that the raised S/D elements 34 are advantageously formed by a sequence that does not include selective epitaxial growth in order to reduce process complexity and cost. In the next step, the gate 14 becomes slightly recessed below the top of the spacers 18/19 when the partially formed Schottky Barrier MOSFET 40 is subjected to an oxide etch such as a conventional BHF dip that removes the silicon oxide hard mask 15 and top portions of the insulator block mask 21 and silicon oxide spacer 18. At this point, the combined thickness of the Schottky barrier 33 and raised S/D element 34 on either side of the gate 14 is from 500 to 700 Angstroms while the gate remains about 500 Angstroms thick.

Figure 12:
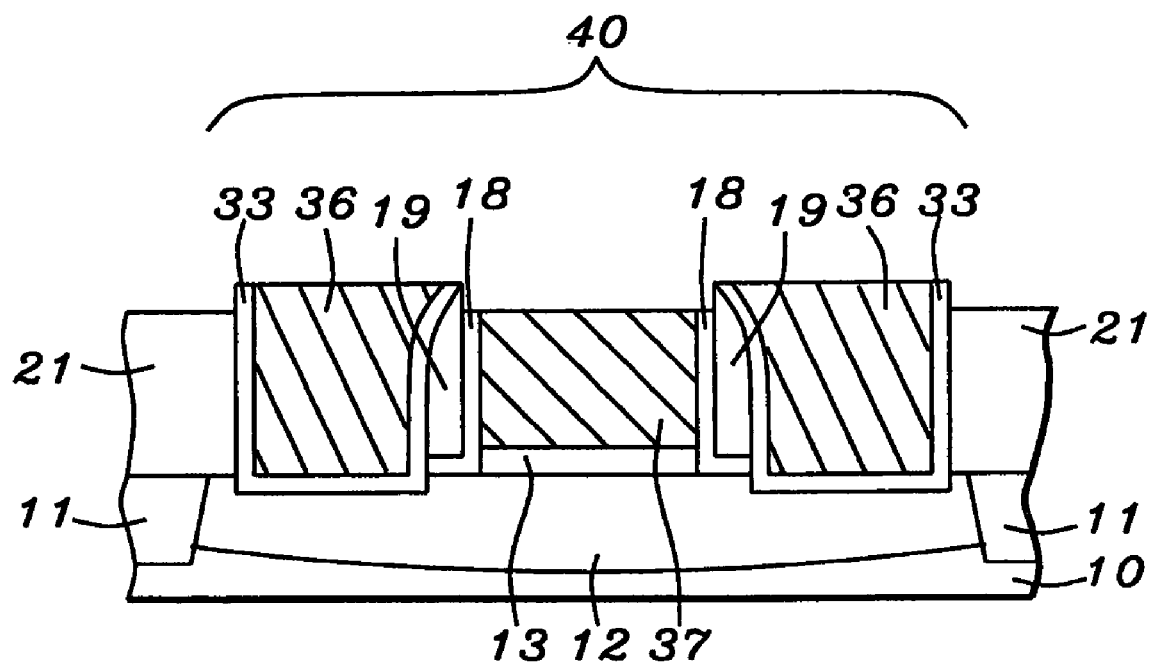

Referring to FIG. 12, the previously described sequence of depositing a metal layer (not shown) on an insulator block mask 21 and adjacent transistor region, performing a silicidation, and selectively removing unreacted metal layer is followed to afford the essentially complete Schottky Barrier MOSFET 40. When the metal layer is Ni having a thickness of 100 to 1000 Angstroms, the silicidation conditions are the same as provided in the first embodiment. Moreover, the same $H_2SO_4/H_2O_2$ treatment described in the first embodiment may be used to remove unreacted metal layer. As a result, a fully silicided and raised S/D element 36 is formed on either side of a fully silicided gate electrode 37. The fully silicided and raised S/D element 36 is formed on the Schottky barrier 33 between an insulator block mask 21 and adjacent spacers 18/19.

The advantages of the second embodiment are the same as mentioned for the first embodiment with an additional benefit that no sacrifice is expected in S/D resistance because the raised S/D element is metallic and extends from the top of the spacers to the substrate. Thus, the second embodiment possesses the additional advantage of vertical engineering wherein the thickness of the raised S/D regions may be adjusted by varying the depth d (FIG. 9) of the S/D 31 and the thickness of Schottky barrier 33. In this case, the Schottky barrier prevents silicon loss from the substrate during the silicidation process to enable shallower S/D regions in the substrate than are achieved in prior art.

The present invention is also the Schottky Barrier MOSFET 40 shown in FIG. 12 that is comprised of a substrate 10, and a fully silicided gate 37 and fully silicided and raised S/D elements 36 that are nearly coplanar. Schottky Barrier MOSFET 40 differs from the first embodiment (transistor 30) in that the LDD extensions 17 and heavily doped regions 20 are omitted in substrate 10. Additionally, the silicidation stop layer in the first embodiment is replaced by a Schottky barrier 33 that extends into the substrate and allows the thickness of the overlying raised S/D elements 36 to be adjusted. As indicated previously, the advantages of the Schottky Barrier MOSFET are the same as those mentioned with respect to the first embodiment. Additionally, thicker raised S/D elements may be formed to make electrical contact with subsequently formed devices.

While this invention has been particularly shown and described with reference to, the preferred embodiments thereof, it will be understood by those skilled in the art that various changes in form and details may be made without departing from the spirit and scope of this invention.

We claim:

1. A method of forming a fully salicided Metal Oxide Semiconductor Field Effect Transistor (MOSFET), comprising:
   (a) providing a substrate having a channel bounded by doped source/drain (S/D) regions formed in an active area defined by isolation regions, and having a patterned gate stack with sides formed thereon that is bounded on said sides by a spacer comprised of an inner silicon oxide layer and an outer silicon nitride layer, said gate stack is comprised of sequentially forming a gate dielectric layer, gate electrode, silicon oxide hard mask and silicon nitride hard mask on the substrate above the channel;
   (b) forming an insulator block mask having sidewalls and a top surface on the substrate above the isolation regions that leaves a substantial portion of said S/D regions exposed;
   (c) forming a silicidation stop layer on the patterned gate stack, spacers, insulator block mask sidewalls and top surface, and on exposed S/D regions of the substrate;
   (d) forming a conductive layer on the silicidation stop layer that has a top surface at a higher level than any portion of the silicidation stop layer;
   (e) performing a planarization of said conductive layer that also removes said silicon nitride hard mask and silicidation stop layer above the insulator block mask, said planarization forms a raised S/D element comprised of said conductive layer on either side of the gate stack;
   (f) removing the silicon oxide hard mask to form a recessed gate electrode between the spacers; and
   (g) depositing a metal layer on the insulator block mask and over the active area and performing a silicidation to form fully silicided, raised S/D elements and a fully silicided gate electrode.

2. The method of claim 1 wherein the gate electrode is comprised of a dopant to tune the work function $\Phi_m$ and threshold voltage (Vth).

3. The method of claim 1 wherein the gate dielectric layer, gate electrode, and silicon oxide hard mask have a combined thickness and the insulator block mask is formed with a thickness that is greater than said combined thickness.

4. The method of claim 1 wherein the silicidation stop layer is a composite layer having a lower metal layer comprised of Ti, Ni, or Co, and an upper TiN layer that is deposited by a PVD, CVD, or ALD method to give a generally conformal layer.

5. The method of claim 1 wherein the conductive layer is comprised of doped or undoped polysilicon, SiGe, SiGeC, or Ge and is deposited at a temperature between about 400° C. to 600° C.

6. The method of claim 1 wherein the metal layer is comprised of Ni, Co, or Ti and the silicidation is performed by heating the substrate in a furnace with a $N_2$ or inert gas ambient at a temperature from about 200° C. to 700° C. for about 15 to 30 minutes or by a rapid thermal anneal (RTA) at about 200° C. to 700° C. for about 10 to 120 seconds.

7. The method of claim 1 further comprised of removing unreacted metal layer following the silicidation by treatment with a $H_2SO_4/H_2O_2$ solution at 130° C. for about 10 minutes.

8. The method of claim 7 further comprised of forming a silicon nitride layer or another copper sealing layer on the fully silicided gate and fully silicided and raised S/D regions after the step of removing the unreacted metal layer.

9. The method of claim 1 wherein the planarization step is a chemical mechanical polish (CMP) process that uses the silicon oxide hard mask as an etch stop.

10. The method of claim 1 wherein the insulator block mask is comprised of silicon oxide, a composite of silicon oxide and silicon nitride, or a composite of other insulator layers that are compatible with a patterning method that forms said insulator block mask.

11. A method of forming a fully salicided Schottky Barrier MOSFET, comprising:
   (a) providing a substrate having a channel bounded by an active area defined by isolation regions, and having a patterned gate stack with sides formed thereon that is bounded on said sides by a spacer comprised of an inner silicon oxide layer and an outer silicon nitride layer, said gate stack is comprised of sequentially forming a gate dielectric layer, gate electrode, silicon oxide hard mask and silicon nitride hard mask on the substrate above the channel;

(b) forming an insulator block mask on the substrate above the isolation regions that leaves a substantial portion of said active area exposed;

(c) etching a trench having a certain depth in the substrate in said active area between said insulator block mask and the spacers;

(d) forming a Schottky barrier layer on the patterned gate stack, spacers, insulator block mask, and in said trench;

(e) forming a conductive layer on the Schottky barrier layer that has a top surface at a higher level than any portion of the Schottky barrier layer;

(f) performing a planarization of said conductive layer that also removes said silicon nitride hard mask and Schottky barrier layer above the insulator block mask, said planarization forms raised S/D elements comprised of said conductive layer;

(g) removing the silicon oxide hard mask to form a recessed gate electrode between the spacers; and (h) depositing a metal layer on the insulator block mask and over the active area and performing a silicidation to form fully silicided raised S/D elements and a fully silicided gate.

12. The method of claim 11 wherein the gate electrode is comprised of a dopant to tune the work function $\Phi_m$ and threshold voltage (Vth).

13. The method of claim 11 wherein the gate dielectric layer, gate electrode, and silicon oxide hard mask have a combined thickness and the insulator block mask is formed with a thickness that is greater than said combined thickness.

14. The method of claim 11 wherein the trench is formed to a depth of about 0 to 100 Angstroms by using said insulator block mask, spacers, and gate stack as an etch mask.

15. The method of claim 11 wherein the Schottky barrier layer is a composite layer having a lower metal layer comprised of Ni, Pt, Co, Dy, Er, or Ti, and an upper TiN layer that is deposited by a PVD, ALD, or CVD method to give a generally conformal layer.

16. The method of claim 11 wherein the conductive layer is comprised of doped or undoped polysilicon, SiGe, SiGeC, or Ge and is deposited at a temperature between about 400° C. to 600° C.

17. The method of claim 11 wherein the metal layer is comprised of Ni, Co, or Ti and the silicidation is performed by heating the substrate in a furnace with a $N_2$ or inert gas ambient at a temperature of about 200° C. to 700° C. for about 15 to 30 minutes or by a rapid thermal anneal (RTA) at about 200° C. to 700° C. for about 10 to 120 seconds.

18. The method of claim 11 further comprised of removing unreacted metal layer following the silicidation by treatment with a $H_2SO_4/H_2O_2$ solution at 130° C. for about 10 minutes.

19. The method of claim 18 further comprised of forming a silicon nitride layer or another copper sealing layer on the fully silicided gate and fully silicided and raised S/D elements after the step of removing the unreacted metal layer.

20. The method of claim 11 wherein the planarization step is a chemical mechanical polish (CMP) process that uses the silicon oxide hard mask as an etch stop.

* * * * *

UNITED STATES PATENT AND TRADEMARK OFFICE
CERTIFICATE OF CORRECTION

| | | |
|---|---|---|
| PATENT NO. | : 7,682,914 B2 | Page 1 of 1 |
| APPLICATION NO. | : 11/981496 | |
| DATED | : March 23, 2010 | |
| INVENTOR(S) | : Patrick Guo Qiang Lo et al. | |

It is certified that error appears in the above-identified patent and that said Letters Patent is hereby corrected as shown below:

In the Title, Item (54), and Col. 1, delete "FULLY SALICIDED (FUCA) MOSFET STRUCTURE" and replace with -- FULLY SALICIDED (FUSA) MOSFET STRUCTURE --.

Signed and Sealed this

Third Day of August, 2010

David J. Kappos
*Director of the United States Patent and Trademark Office*